United States Patent [19]
Um

[11] Patent Number: 5,710,657
[45] Date of Patent: Jan. 20, 1998

[54] MONOMORPH THIN FILM ACTUATED MIRROR ARRAY

[75] Inventor: Gregory Um, Torrance, Calif.

[73] Assignee: Aura Systems, Inc., El Segundo, Calif.

[21] Appl. No.: 424,148

[22] Filed: Apr. 17, 1995

Related U.S. Application Data

[63] Continuation-in-part of Ser. No. 200,861, Feb. 23, 1994, Pat. No. 5,481,396.

[51] Int. Cl.$^6$ ................................................ G02B 26/00
[52] U.S. Cl. .................... 359/295; 359/291; 359/221; 359/224; 310/328; 310/366
[58] Field of Search .................................... 359/295, 290, 359/291, 848, 221, 214, 224; 310/328, 333, 366

[56] References Cited

U.S. PATENT DOCUMENTS

| | | | |
|---|---|---|---|
| 3,544,201 | 12/1970 | Fowler et al. | 359/224 |
| 4,736,132 | 4/1988 | Culp | 310/333 |
| 5,229,679 | 7/1993 | Higuchi et al. | 310/328 |
| 5,233,258 | 8/1993 | Myoga et al. | 310/328 |
| 5,247,222 | 9/1993 | Engle | 310/328 |
| 5,455,477 | 10/1995 | Sano et al. | 310/328 |
| 5,481,396 | 1/1996 | Ji et al. | 359/295 |

*Primary Examiner*—Loha Ben
*Attorney, Agent, or Firm*—Lisa Merkadeau; Kathy Mojibi

[57] ABSTRACT

A thin film actuated mirror is disclosed having a substrate, a deformable structure mounted to the substrate, and a mirror surface interconnected to the deformable structure such that the mirror surface tilts in response to the deformation of the deformable material layer. The deformation occurs due to the effective strain gradient across the monomorph thickness which is accomplished by varying the electric field across the thickness or the strain parameter across the thickness. The deformable structure includes an active material layer fabricated from a semi-conductive ferroelectric ceramic material and two metal electrodes, each of the electrodes being mounted on opposing surfaces of the active material layer, wherein an electrical signal applied across the active material layer between the electrodes causes deformation of the active material layer. Alternatively, the active material layer may be fabricated from two layers, an upper layer of an active piezoelectric material and a lower layer of an inactive material.

10 Claims, 1 Drawing Sheet

MONOMORPH THIN FILM ACTUATED MIRROR ARRAY

RELATED APPLICATION DATA

This application is a continuation-in-part of commonly owned, Ser. No. 08/200,861, entitled "Thin Film Actuated Mirror Array" which was filed on Feb. 23, 1994, now U.S. Pat. No. 5,481,396 and is incorporated by reference herein. This application is also related to the commonly owned, co-pending Ser. No. 08/424,149 entitled "Thin Film Mirror Array For Providing Double Tilt Angle" which was filed on Apr. 17, 1995 and is incorporated herein by reference.

FIELD OF THE INVENTION

The present invention relates generally to actuated mirror arrays for optical projection video systems, and more particularly to thin film actuated mirror arrays for optical projection systems.

BACKGROUND OF THE INVENTION

In a particular type of an optical projection video display system, an actuated mirror array is used to control the light modulation for each pixel. In one system, the mirror array is illuminated by a source of optical energy. Under electronic control, the orientation of each of the mirrors in the array is varied to determine a propagation path for a beam of light reflecting from each mirror. An example of an optical projection video display system is shown in FIG. 1. In this system light is emitted from a light source 120, and is reflected off a Schlieren stop mirror 122 at an angle toward the actuated mirror array 124. The light is reflected from the actuated mirror array at a controlled angle. The angle is controlled through the actuation of the mirror array. The light reflected from the mirror array 124 passes through a first lens 126, bypasses the Schlieren stop mirror, and passes through a second lens 128 to a screen. The present invention discloses actuated mirrors for mirror arrays used in such an optical projection video display system.

A unimorph is a piezoelectric element externally bonded to a metal material layer. The metal layer is controlled by applying a DC electrical signal across the piezoelectric material, which causes the piezoelectric material to change shape. The change in shape of the piezoelectric material causing an axial buckling or deflection in the metal layer as the metal layer opposes movement of the piezoelectric material. The degree of buckling of the metal layer is controlled by the amplitude of the DC electrical signal. A bimorph includes two layers of piezoelectric element. It is known in the art to create unimorph and bimorph piezoelectric elements by direct deposition or using adhesives to bond the metal layer to the piezoelectric elements. For example, U.S. Pat. No. 5,085,497 discloses methods for fabricating mirror arrays for optical projection systems.

A problem with the known actuated mirror arrays, however, is that the mirror arrays are difficult to manufacture. Another problem with the known actuated mirror arrays is that undesired diffusion occurs between the lower metal layer and the piezoelectric element. For these reasons, an improved actuated mirror array is needed.

Piezoelectric ceramic material deforms in relation to the electric field applied across the thickness of the material and the piezo strain constant of the material. Therefore in order to deform or vary the deformation of the material, either the electric field or the piezo constant is varied. The present invention solves the problems of the known actuated mirror arrays by providing a thin film actuated mirror array that is easily fabricated and which creates deformation by varying either the electric field across the thickness of the material, the piezo constant of the material, or both.

SUMMARY OF THE INVENTION

Accordingly, it is a primary object of the present invention to overcome one or more disadvantages and limitations of the prior art.

A significant object of the present invention is to provide a monomorph thin film actuated mirror array.

Another aspect of the present invention is to provide a thin film actuated mirror array that is easily fabricated.

According to a broad aspect of the present invention, a thin film actuated mirror is disclosed having a substrate, a deformable structure mounted to the substrate, and a mirror surface interconnected to the deformable structure such that the mirror surface tilts in response to the deformation of the deformable material layer. The deformable structure includes an active material layer fabricated from a semiconductive ferroelectric ceramic material and two metal electrodes, each of the electrodes being mounted on opposing surfaces of the active material layer, wherein an electrical signal applied across the active material layer between the electrodes causes deformation of the active material layer. Alternatively, the active material layer may be fabricated from two layers, an upper layer of an active piezoelectric material and a lower layer of an inactive high dielectric material.

A feature of the present invention is that the thin film actuated mirror arrays are easily manufactured.

Another feature of the present invention is that undesired diffusion between the lower layer of metal and the piezoelectric element is reduced.

These and other objects, advantages and features of the present invention will become readily apparent to those skilled in the art from a study of the following description of an exemplary preferred embodiment when read in conjunction with the attached drawing and appended claims.

DESCRIPTION OF AN EXEMPLARY PREFERRED EMBODIMENT

Figure 1:
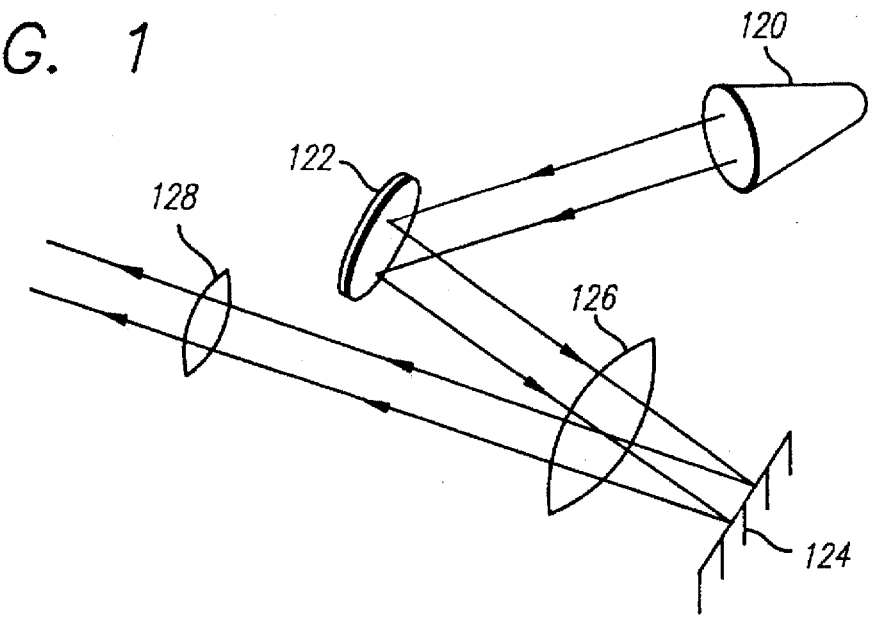
FIG. 1 is a diagram showing an optics implementation of the thin film actuated mirror array.
Figure 2:
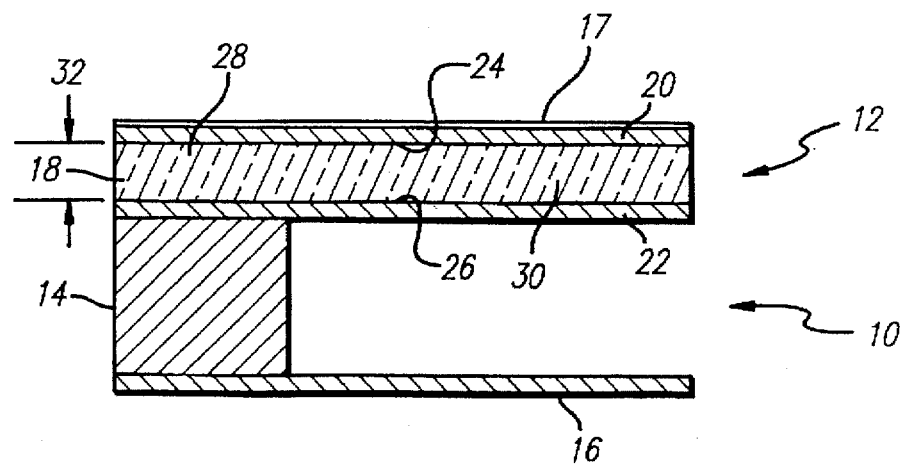
FIG. 2 is a side view of a first embodiment of a thin film actuated mirror array in a monomorph form.

Referring first to FIG. 2, a first embodiment 10 of a thin film actuated mirror array of the present invention is described. The first embodiment 10 is a monomorph thin film embodiment and includes a deformable structure 12, a pedestal member 14, a substrate 16, and a mirror surface 17. The deformable structure 12 includes a layer of active material 18 disposed intermediate a first layer of metal 20 and a second layer of metal 22. The active material layer 18 has an upper surface 24 and a lower surface 26. The first layer of metal 20 is in contact with the upper surface 24 of the active material layer and functions as an upper metal electrode. The second layer of metal 22 is in contact with the lower surface 26 of the active material layer and functions as a lower metal electrode. The deformable structure 12 is supported in a cantilevered fashion by the pedestal member 14. The pedestal member 14 is coupled to the substrate 16.

In this first embodiment of the present invention, the deformable structure 12 includes a first portion 28 mounted to the pedestal 14 and a second portion 30 cantilevered from the pedestal 14. An electrical field is applied across the deformable structure 12 from the substrate active matrix 16 through the pedestal 14 which conducts the electrical signal. The application of the electric field will either cause the active material layer 18 to contract or expand, depending on the type of active material and the polarity of the electric field. The contracting or expanding of the active layer material 18 causes it to bend. The mirror surface 17 is interconnected to the deformable structure 12 such that the mirror surface tilts in response to the deformation of the active material layer 18.

The first embodiment 10 of the present invention creates deformation in the active material layer 18 by varying the electric field across the thickness of the active material layer 18. More specifically, the active material used in the active material layer 18 is preferably a semiconductive ferroelectric ceramic material. The active material layer 18 has a predetermined thickness 32. The active material has an energy barrier across the thickness 32. When an electric field is applied across the thickness 32, a gradient of the electric field across the thickness 32 is created by the energy barrier. As previously described, the change in electric field across the thickness of the active material layer 18 creates a bending motion in the active material layer 18.

Figure 3:
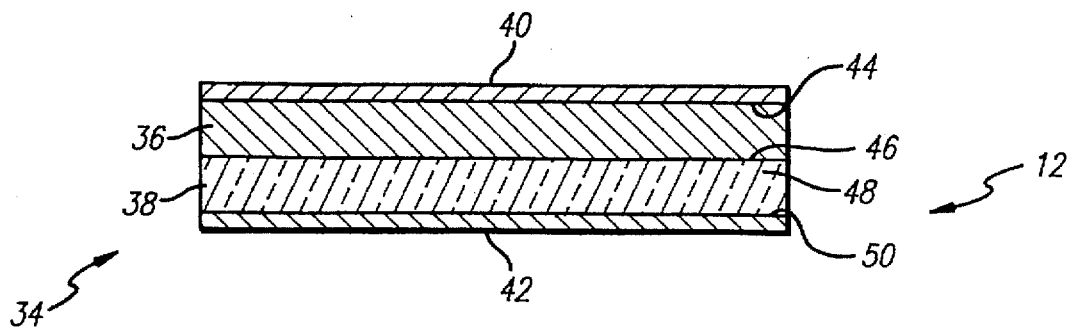
FIG. 3 is a side view of an alternative embodiment of the monomorph form.

Referring now to FIG. 3, a second embodiment 34 of the thin film actuated mirror array is shown. The second embodiment 34 creates a bending motion in the deformable structure 12 by using spatial variation of the piezo strain constant, in comparison to the first embodiment which created bending motion by varying the electric field across the thickness of the material. As previously described, varying the piezo constant in the material will cause a deformation of the material when the electric field is applied.

The deformable structure 12 is comprised of a dual layer structure. The dual layer structure includes an upper active material layer 36, a lower inactive material layer 38, a first layer of metal 40, and a second layer of metal 42. The upper active material layer 36 defines an upper surface 44 and a lower surface 46. The first layer of metal 40 is disposed in contact with the upper active material layer upper surface 44 and functions as an upper electrode. The lower inactive material layer 38 also defines an upper surface 48 and a lower surface 50. The lower inactive material layer upper surface 48 is disposed in contact with the upper active material layer lower surface 46. The second layer of metal 42 is disposed in contact with the lower surface 50 of the inactive material layer and functions as a lower metal electrode.

The upper active layer 36 is preferably comprised of an active piezoelectric material. The lower inactive layer 38 may be comprised of a piezoelectric material having a similar dielectric constant as the upper active layer 36, but with a stoichiometry to render it an inactive material. Alternatively, the inactive lower level 38 may be comprised of a PMN material of the highest dielectric constant.

By utilizing an the inactive lower layer 38, the deformable structure 12 does not require a third electrode disposed intermediate the upper and lower layers 36,38, therefore simplifying the manufacturing process. An additional benefit is that the active and inactive layers 36, 38 will adhere together easier than adhering to a third metal layer. This second embodiment further eliminates some steps in the manufacturing process, such as tungsten filling and some masking steps.

Additionally, due to the high dielectric constant of the inactive material layer 38, the voltage drop across the inactive material is minimal. A minor increase in voltage is not detrimental in the thin film structure, as the voltage level is generally adequate.

The second embodiment of the invention shown in FIG. 3 may be cantilevered from a pedestal as described herein with reference to FIG. 2. It is to be understood, however, that both the first embodiment 10 and the second embodiment 34 of the monomorph thin film structure may be mounted to the active substrate 16 and interconnected to the mirror surface 17 in other ways known in the art, or described in this application or in other applications incorporated herein by reference.

It is to be understood that a spatial variation of the piezo strain constant may be achieved by other known methods. Moreover, the first embodiment and second embodiment of the present invention may be combined to create a bending motion by varying both the electric field across the active material layer and the piezo strain constant of the material.

It is also to be noted that, although the descriptions of the embodiments refer to piezoelectric material, other type of motion-inducing material may be used. For example, electrostrictive or magnetostrictive material may be used to obtain the desired expansion of shrinkage.

There has been described hereinabove several exemplary preferred embodiments of the thin film actuated mirror array according to the principles of the present invention. Those skilled in the art may now make numerous uses of, and departures from, the above-described embodiments without departing from the inventive concepts disclosed herein. Accordingly, the present invention is to be defined solely by the scope of the following claims.

I claim as my invention:

1. A thin film actuated mirror comprising:

an active substrate;

at least one deformable structure mounted to said substrate, said deformable structure further comprising an active material layer, said active material layer having two opposing surfaces, a thickness and a strain constant, and two metal electrodes, each of said electrodes being mounted on a respective one of said opposing surfaces of said active material layer, wherein an electrical field is applied across said active material layer between said electrodes;

means for varying the electric field applied across the thickness of said active material layer in order to cause deformation of said active material layer; and a mirror surface, said mirror surface being interconnected to said deformable structure such that said mirror surface tilts in response to the deformation of said deformable material layer.

2. A thin film actuated mirror in accordance with claim 1 wherein said active material layer is comprised of a semiconductive ferroelectric ceramic material.

3. A thin film actuated mirror in accordance with claim 1 further comprising means for varying the strain constant of the active material layer across the thickness.

4. A thin film actuated mirror comprising:

an active substrate;

at least one deformable structure mounted to said substrate, said deformable structure further comprising an active material layer having an upper and a lower surface, a strain constant and a thickness, a first metal electrode disposed in contact with the upper surface of said active material layer and a second metal electrode disposed in contact with the lower surface of said active material layer, wherein an electrical field is applied across said active material layer between said electrodes to create deformation of said active material layer;

means for varying the strain constant of the active material layer across the thickness; and a mirror surface, said mirror surface being interconnected to said deformable structure such that said mirror surface tilts in response to the deformation of said deformable material layer.

5. A thin film actuated mirror in accordance with claim 4 wherein said active material layer further comprises a first active material layer having a lower surface and a second inactive material layer having an inactive upper surface, wherein said inactive upper surface is disposed in contact with said active lower surface.

6. A thin film actuated mirror in accordance with claim 5 wherein said inactive material layer is comprised of an inactive piezoelectric material.

7. A thin film actuated mirror in accordance with claim 5 wherein said inactive material layer is comprised of pmn material.

8. A thin film actuated mirror comprising:

a pedestal;

at least one deformable structure cantilevered from said pedestal, said deformable structure further comprising a semiconductive ferroelectric ceramic material layer having two opposing surfaces and two metal electrodes, each of said electrodes being mounted on a respective one of said opposing surfaces of said semiconductive ferroelectric ceramic material layer, wherein an electrical signal applied across said semiconductive ferroelectric ceramic material layer between said electrodes causes deformation of said semiconductive ferroelectric ceramic material layer; and a mirror surface, said mirror surface being interconnected to said deformable structure such that said mirror surface tilts in response to the deformation of said deformable semiconductive ferroelectric ceramic material layer.

9. A thin film actuated mirror in accordance with claim 8 wherein said semiconductive ferroelectric ceramic material layer further comprises an upper layer and lower layer, said upper layer being comprised of an active piezoelectric material and said lower layer being comprised of an inactive piezoelectric material.

10. A thin film actuated mirror in accordance with claim 8 wherein said semiconductive ferroelectric ceramic material layer further comprises an upper layer and lower layer, said upper layer being comprised of an active piezoelectric material and said lower layer being comprised of a PMN material.

\* \* \* \* \*